United States Patent
Shin

(10) Patent No.: US 10,073,637 B2
(45) Date of Patent: Sep. 11, 2018

(54) DATA STORAGE DEVICE BASED ON A DESCRIPTOR AND OPERATING METHOD THEREOF

(71) Applicant: SK hynix Inc., Gyeonggi-do (KR)

(72) Inventor: Dong Jae Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 56 days.

(21) Appl. No.: 15/240,877

(22) Filed: Aug. 18, 2016

(65) Prior Publication Data
US 2017/0364286 A1    Dec. 21, 2017

(30) Foreign Application Priority Data

Jun. 17, 2016 (KR) .................. 10-2016-0075996

(51) Int. Cl.
| | | |
|---|---|---|
| G06F 3/06 | (2006.01) | |
| G11C 16/10 | (2006.01) | |
| G06F 1/26 | (2006.01) | |
| G11C 16/26 | (2006.01) | |
| G06F 12/00 | (2006.01) | |
| G11C 5/14 | (2006.01) | |
| G11C 16/30 | (2006.01) | |

(52) U.S. Cl.
CPC ............ *G06F 3/0619* (2013.01); *G06F 1/266* (2013.01); *G06F 3/0656* (2013.01); *G06F 3/0659* (2013.01); *G06F 3/0688* (2013.01); *G06F 12/00* (2013.01); *G11C 5/144* (2013.01); *G11C 16/30* (2013.01)

(58) Field of Classification Search
CPC .... G06F 3/0619; G06F 3/0659; G06F 3/0688; G06F 3/0679; G06F 1/226; G06F 1/28; G06F 1/30; G06F 1/305; G06F 3/0656; G11C 16/10; G11C 16/26; G11C 5/143; G11C 5/147

See application file for complete search history.

(56) References Cited

U.S. PATENT DOCUMENTS

| | | | | |
|---|---|---|---|---|
| 5,371,709 | A * | 12/1994 | Fisher .................... | G11C 5/143 365/226 |
| 6,822,899 | B1 * | 11/2004 | Boulos ................. | G11C 16/225 365/185.02 |
| 9,224,433 | B1 * | 12/2015 | Pedersen ................. | G11O 5/14 |
| 2006/0087891 | A1 * | 4/2006 | Jeong ..................... | G11C 16/10 365/185.28 |
| 2006/0179204 | A1 * | 8/2006 | Cohen ..................... | H04L 47/56 710/316 |

(Continued)

FOREIGN PATENT DOCUMENTS

KR    1020150030190    3/2015

*Primary Examiner* — Michael Krofcheck
(74) *Attorney, Agent, or Firm* — IP & T Group LLP

(57) ABSTRACT

A data storage device includes a nonvolatile memory device; a control unit configured to generate a descriptor in which works for controlling the nonvolatile memory device are written; a memory control unit configured to provide control signals and write data to the nonvolatile memory device based on the descriptor; and a voltage detector configured to provide a voltage drop signal to the memory control unit in the case where a first operating voltage provided to the memory control unit or a second operating voltage provided to the nonvolatile memory device, drops.

20 Claims, 9 Drawing Sheets

(56) References Cited

U.S. PATENT DOCUMENTS

| | | | |
|---|---|---|---|
| 2007/0130390 A1* | 6/2007 | Hao | H04L 45/00 710/52 |
| 2009/0013113 A1* | 1/2009 | Henry | G06F 13/423 710/107 |
| 2009/0019194 A1* | 1/2009 | Toyama | G06F 3/061 710/52 |
| 2009/0077305 A1* | 3/2009 | Shin | G06F 13/1668 711/103 |
| 2012/0011298 A1* | 1/2012 | Lee | G06F 13/1668 711/102 |
| 2013/0301373 A1* | 11/2013 | Tam | G11O 5/143 365/228 |

* cited by examiner

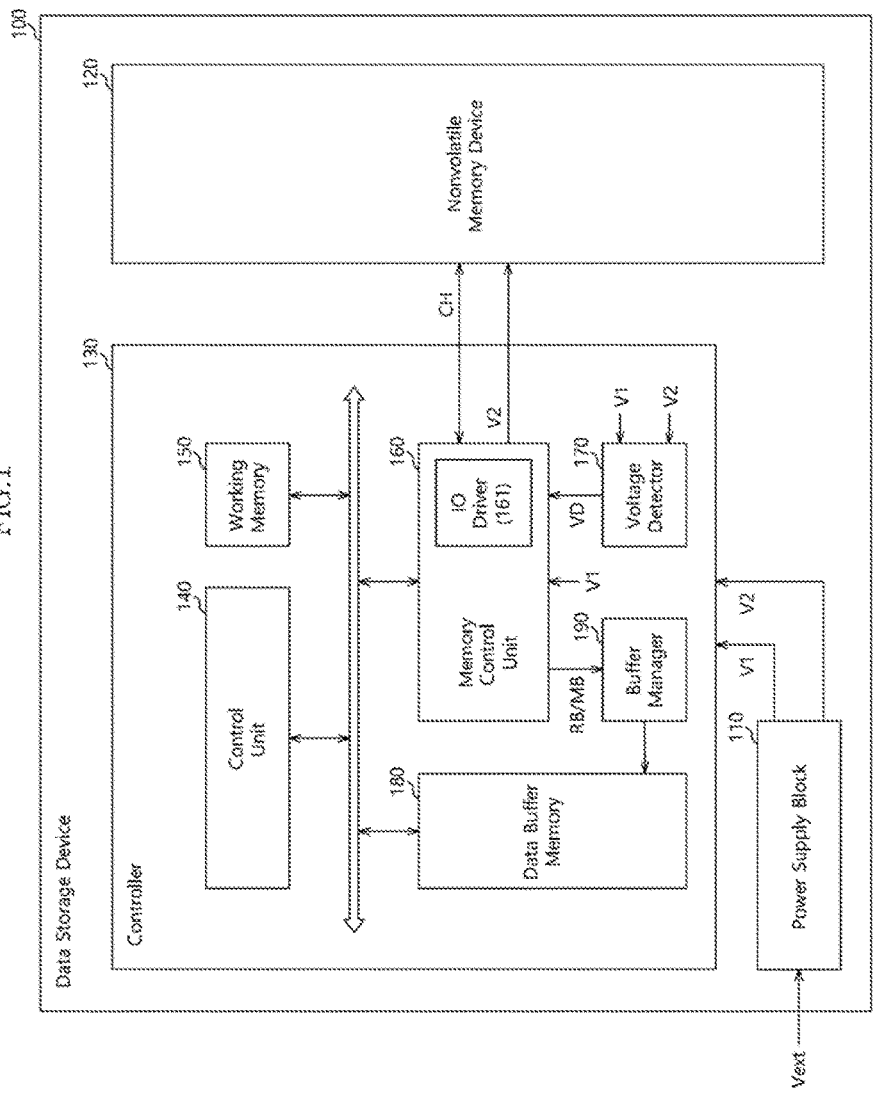

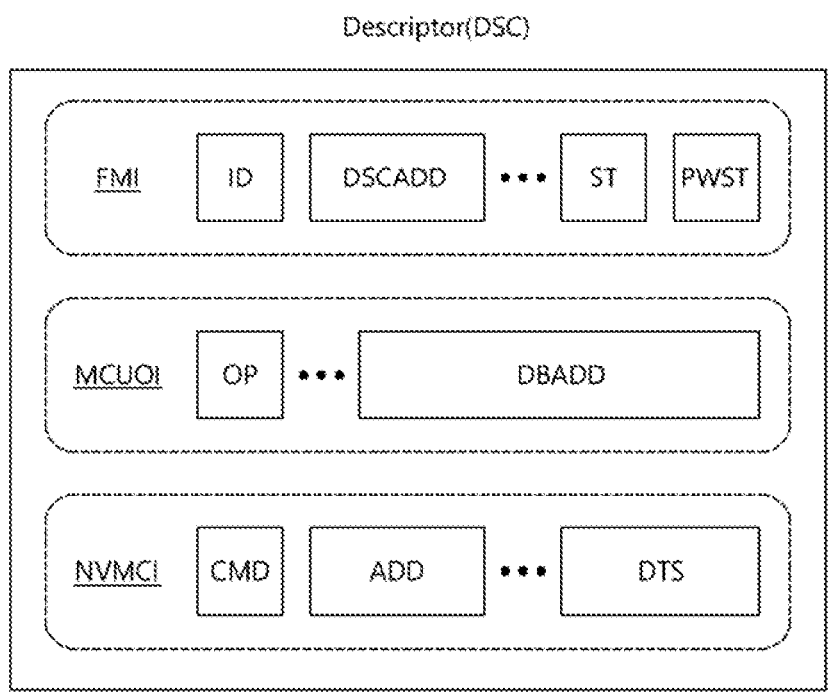

DATA STORAGE DEVICE BASED ON A DESCRIPTOR AND OPERATING METHOD THEREOF

CROSS-REFERENCES TO RELATED APPLICATION

The present application claims priority under 35 U.S.C. § 119(a) to Korean application number 10-2016-0075996, filed on Jun. 17, 2016, which is herein incorporated by reference in its entirety.

BACKGROUND

1. Technical Field

Various embodiments generally relate to a data storage device that uses a nonvolatile memory device as a storage medium.

2. Related Art

Recently, the paradigm for the computer environment has been changed into ubiquitous computing so that computer systems can be used anytime and anywhere. Due to this fact, the use of portable electronic devices such as mobile phones, digital cameras, and notebook computers has rapidly increased. In general, such portable electronic devices use a data storage device which uses a memory device. A data storage device is used to store data to be used in a portable electronic device.

A data storage device using a memory device provides advantages in that, since there is no mechanical driving part, stability and durability are excellent, information access speed is high and power consumption is small. Data storage devices having such advantages include a universal serial bus (USB) memory device, memory cards having various interfaces, a universal flash storage (UFS) device, and a solid state drive (SSD).

SUMMARY

Various embodiments are directed to a data storage device capable of improving reliability of data stored in a nonvolatile memory device, even when an operating voltage drops, and an operating method thereof.

In an embodiment, a data storage device may include: a nonvolatile memory device; a control unit configured to generate a descriptor in which works for controlling the nonvolatile memory device are written; a memory control unit configured to provide control signals and write data to the nonvolatile memory device based on the descriptor; and a voltage detector configured to provide a voltage drop signal to the memory control unit in the case where a first operating voltage provided to the memory control unit or a second operating voltage provided to the nonvolatile memory device drops.

In an embodiment, a method for operating a data storage device including a nonvolatile memory device and a controller which controls the nonvolatile memory device may include: providing data to the nonvolatile memory device; determining whether a voltage drop has occurred in even any one of a first operating voltage provided to the controller and a second operating voltage provided to the nonvolatile memory device, before the data are completely provided; and retaining allocation for a region of a data buffer memory where the data are stored, in the case where it is determined that a voltage drop has occurred.

In an embodiment, a data storage device may include: a nonvolatile memory device; a control unit configured to generate a first descriptor in which works for controlling the nonvolatile memory device are written; a memory control unit configured to provide control signals and data to the nonvolatile memory device based on the first descriptor; and a voltage detector configured to provide a voltage drop signal to the memory control unit in the case where even any one of a first operating voltage provided to the memory control unit and a second operating voltage provided to the nonvolatile memory device has dropped, wherein the memory control unit reports a power state information indicating that a voltage drop has occurred, to the control unit, through the first descriptor.

According to the embodiments, it is possible to stably store data in a nonvolatile memory device, even though an operating voltage drops.

BRIEF DESCRIPTION OF THE DRAWINGS

FIG. 1 is a block diagram illustrating a data storage device in accordance with an embodiment.

FIG. 2 is a diagram to describe a descriptor which is generated by a control unit in accordance with the embodiment.

FIG. 3 is a table to describe the operation of a voltage detector in accordance with the embodiment.

DETAILED DESCRIPTION

Figure 4:
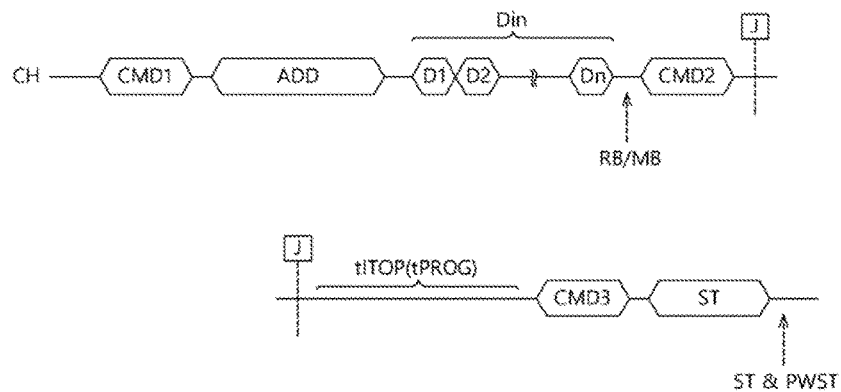
FIG. 4 is a diagram to describe the operation of a memory control unit in accordance with the embodiment.

Hereinafter, a data storage device and an operating method thereof will be described below with reference to the accompanying drawings through various examples of embodiments.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily apply the technical concept of the present invention.

It is to be understood herein that embodiments of the present invention are not limited to the particulars shown in the drawings and that the drawings are not necessarily to scale and in some instances proportions may have been exaggerated to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a data storage device and an operating method thereof will be described below with reference to the accompanying drawings through various examples of embodiments.

FIG. 1 is a block diagram illustrating a data storage device 100 in accordance with an embodiment.

Referring to FIG. 1, the data storage device 100 may include a nonvolatile memory device 120 and a controller 130. The data storage device 100 may also include a power supply block 110. The controller 130 may include a control unit 140, a working memory 150, a memory control unit 160, a voltage detector 170, a data buffer memory 180, and a buffer manager 190.

The data storage device 100 may store data accessed by a host device (not shown) such as a mobile phone, an MP3 player, a laptop computer, a desktop computer a game player, a television (TV), an in-vehicle infotainment system, and so forth. The data storage device 100 may also be referred to as a memory system.

The data storage device 100 may be manufactured as any one of various kinds of storage devices according to the protocol of an interface which is electrically coupled with the host device. For example, the data storage device 100 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one among various kinds of package types. For example, the data storage device 100 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 100 may include the power supply block 110. The power supply block 110 may be constructed by a power supply, a power management integrated circuit (PMIC), or the like.

The power supply block 110 may generate operating voltages V1 and V2 by using an external voltage Vext provided from an external device (not shown). The voltage supply block 110 may provide the operating voltages V1 and V2 to the controller 130.

Although not shown, the operating voltages V1 and V2 may be provided to respective internal blocks of the controller 130 through power lines. For example, the first operating voltage V1 may be provided to a memory control unit 160. For example, the second operating voltage V2 may be provided to a nonvolatile memory device 120 through the memory control unit 160.

The nonvolatile memory device 120 may operate as the storage medium of the data storage device 100. The nonvolatile memory device 120 may be configured as any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using transition metal oxide. The FRAM, the MRAM, the PCRAM and the RERAM are a type of nonvolatile random access memory devices capable of random access to memory cells. The nonvolatile memory device 120 may be configured as a combination of a NAND flash memory device and the above-described various types of nonvolatile random access memory devices.

The nonvolatile memory device 120 may be coupled with the controller 130 through a channel CH. The channel CH may represent signal lines capable of transferring control signals such as a command, an address, a control clock signal and data.

The controller 130 may operate using the operating voltage V1 provided from the power supply block 110.

The control unit 140 may control general operations of the controller 130. The control unit 140 may drive an instruction or an algorithm of a code type, that is, a firmware or a software, loaded in the working memory 150, and may control operations of the internal function blocks of the controller 130. The control unit 140 may be constructed by a micro control unit (MCU) or a central processing unit (CPU).

The working memory 150 may tore a software to be driven by the control unit 140. Also, the working memory 150 may store data necessary in driving of the software. The working memory 150 may be constructed by a random access memory such as a dynamic random access memory (DRAM) or a static random access memory (SRAM).

The memory control unit 160 may control the nonvolatile memory device 120 based on the descriptor generated by the control unit 140. The descriptor will be described later in detail with reference to FIG. 2. The memory control unit 160 may also be referred to as a memory interface unit.

The memory control unit 160 may provide control signals to the nonvolatile memory device 120, based on the descriptor. The control signals may include a command, an address, a control clock signal and so forth for controlling the nonvolatile memory device 120. The memory control unit 160 may provide the data stored in the data buffer memory 180, to the nonvolatile memory device 120, based on the descriptor. The memory control unit 160 may include an input/output driver (IO driver) 161 for generating and driving control signals and data.

The voltage detector 170 may detect the voltage levels of the operating voltages V1 and V2 which are provided from the power supply block 110 to the controller 130. The voltage detector 170 may provide a voltage drop signal VD to the memory control unit 160, based on a result of detecting the voltage levels of the operating voltages V1 and V2. The operation of the voltage detector 170 will be described later in detail with reference to FIG. 3.

The data buffer memory 180 may temporarily store data to be stored in the nonvolatile memory device 120. The data buffer memory 180 may buffer the data read from the nonvolatile memory device 120. Although not shown, the data buffer memory 180 may be divided into a plurality of regions for the sake of convenience iii management.

The buffer manager 190 may divide the data buffer memory 180 into the plurality of regions. The buffer manager 190 may allocate or release the regions of the data buffer memory 180. Allocation of a region may represent a state in which data are stored in the corresponding region or represent that the data stored in the corresponding region are valid. Release of a region may represent a state in which data are not stored in the corresponding region or represent that the data stored in the corresponding region are invalid.

The buffer manager 190 may generate and manage a buffer memory management table to allocate or release the regions of the data buffer memory 180.

The buffer manager 190 may release a region of the data buffer memory 180 according to a buffer release signal RB provided from the memory control unit 160. The buffer manager 190 may retain the allocation of a region of the data buffer memory 180 according to a buffer retention signal MB provided from the memory control unit 160. The operation of the buffer manager 190 will be described later in detail with reference to FIGS. 5 and 6.

FIG. 2 is a diagram to describe a descriptor DSC which is generated by the control unit 140 of FIG. 1 in accordance with the embodiment.

Referring to FIG. 2, the descriptor DSC may represent a work order in which tasks to be processed by the memory control unit 160 to control the nonvolatile memory device 120 are written. The descriptor DSC may be generated by the control unit 140, and be decoded and executed by the memory control unit 160. For this reason, the descriptor DSC may include firmware management information FMI that is managed by the control unit 140 or the firmware driven by the control unit 140, memory control unit operation information MCUOI that is necessary for the operation of the memory control unit 160, and a nonvolatile memory device control information NVMCI that the memory control unit 160 refers to in order to control the nonvolatile memory device 120.

The firmware management information FMI may include a descriptor identifier ID that is assigned when the descriptor DSC is generated and an address DSCADD of the working memory 150 where the descriptor DSC is stored.

Also, the firmware management information FMI may include a state information ST of the nonvolatile memory device 120 that is reported to the control unit 140, as a processing result of the descriptor DSC, and a power state information PWST that indicates whether the operating voltages V1 and V2 have dropped or not. The control unit 140 may perform follow-up measures for the operation for example, an error handling operation performed according to the descriptor DSC, by referring to the state information ST of the nonvolatile memory device 120 and the power state information PWST.

The memory control unit operation information MCUOI may include an operation information OP that indicates an operation for example, a read or write operation to be performed by the nonvolatile memory device 120. The memory control unit operation information MCUOI may further include an address DBADD of the data buffer memory 180 where data to be stored in the nonvolatile memory device 120 is stored or an address DBADD of the data buffer memory 180 where data read from the nonvolatile memory device 120 is to be stored.

The nonvolatile memory device control information NVMCI may include a command CMD and an address ADD to be provided to the nonvolatile memory device 120 and a data size information DTS that represents the size of data stored in the nonvolatile memory device 120 or the size of data read from the nonvolatile memory device 120.

FIG. 3 is a table to describe the operation of the voltage detector 170 of FIG. 1 in accordance with the embodiment. As described above, the first operating voltage V1 may be an operating voltage which is provided to the internal function blocks of the controller 130, and the second operating voltage V2 may be an operating voltage which is provided to the nonvolatile memory device 120.

The voltage detector 170 may detect whether the level of the first operating voltage V1 is less than the level of a first threshold voltage Vth1. When the level of the first operating voltage V1 is less than the level of the first threshold voltage Vth1, the voltage detector 170 may provide the voltage drop signal VD indicating that a voltage drop has occurred, to the memory control unit 160.

The voltage detector 170 may detect whether the level of the second operating voltage V2 is less than the level of a second threshold voltage Vth2. When the level of the second operating voltage V2 is less than the level of the second threshold voltage Vth2, the voltage detector 170 may provide the voltage drop signal VD to the memory control unit 160 indicating that a voltage drop has occurred.

That is, when a voltage drop occurs in any one of the first operating voltage V1 and the second operating voltage V2, the voltage detector 170 may provide the voltage drop signal VD to the memory control unit 160.

FIG. 4 is a diagram to describe the operation of the memory control unit 160 of FIG. 1 in accordance with the embodiment. For instance, the control flow that is, the transmission process of control signals and data of the memory control unit 160 which controls the write operation of the nonvolatile memory device 120 based on the descriptor is illustrated in FIG. 4.

The memory control unit 160 may provide a first command CMD1 that commands a write operation, to the nonvolatile memory device 120. The memory control unit 160 may provide an address ADD of memory cells of the nonvolatile memory device 120 in which data is to be stored, to the nonvolatile memory device 120.

The memory control unit 160 may provide data D1 to Dn to the nonvolatile memory device 120. A period in which the data D1 to Dn are provided to the nonvolatile memory device 120 will be defined as a data input period Din. After the data input period Din, the memory control unit 160 may provide the buffer retention signal MB or the buffer release signal RB to the buffer manager 190, based on the voltage drop signal VD provided from the voltage detector 170.

When the voltage drop signal VD is received before the data input period Din finishes that is, before providing of data is completed, the memory control unit 160 may provide the buffer retention signal MB to the buffer manager 190. Conversely, when the voltage drop signal VD is not received before the data input period Din finishes, the memory control unit 160 may provide the buffer release signal RB to the buffer manager 190.

After the data input period Din, the memory control unit 160 may provide a second command CMD2 to the nonvolatile memory device 120, that commands an internal operation ITOP to be started. The internal operation ITOP may represent an operation in which the data D1 to Dn are actually stored in the memory cells of the nonvolatile memory device 120. Furthermore, the transmission process of the second command CMD2 may be omitted.

After an internal operation time tITOP or tPROG passes, the memory control unit 160 may provide a third command CMD3 for determining the state of the nonvolatile memory device 120, to the nonvolatile memory device 120. The nonvolatile memory device 120 may provide a result of the write operation performed to the memory control unit 160, that is, whether the write operation has passed or failed, as indicated by the state information ST.

After the state information ST of the nonvolatile memory device 120 is received, the memory control unit 160 may report the state information ST of the nonvolatile memory device 120 and the power state information PWST to the control unit 140 through the descriptor DSC, based on the state information ST provided from the nonvolatile memory device 120 and the voltage drop signal VD provided from the voltage detector 170.

Figure 5:
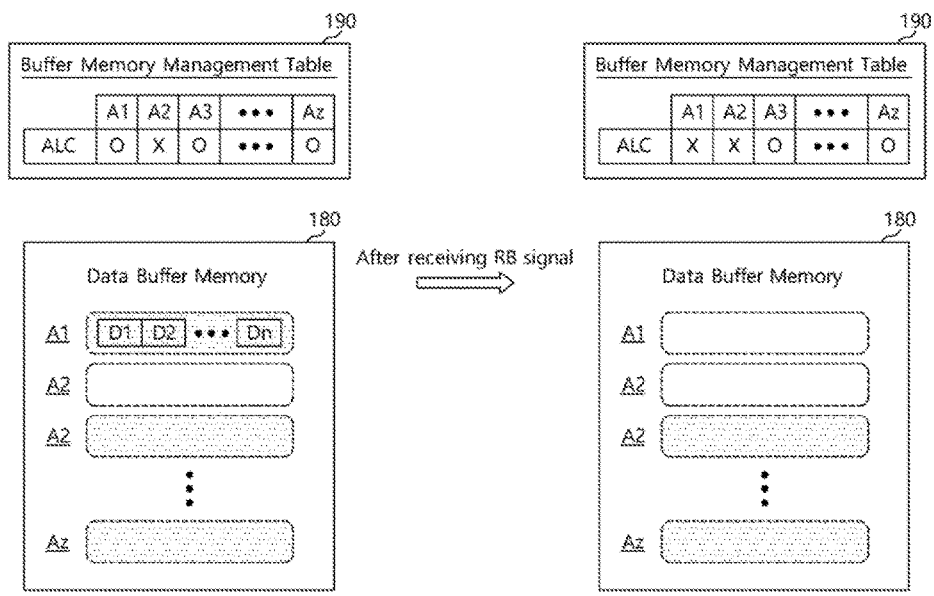
FIGS. 5 and 6 are diagrams to describe the operations of a buffer manager in accordance with the embodiment.
Figure 6:
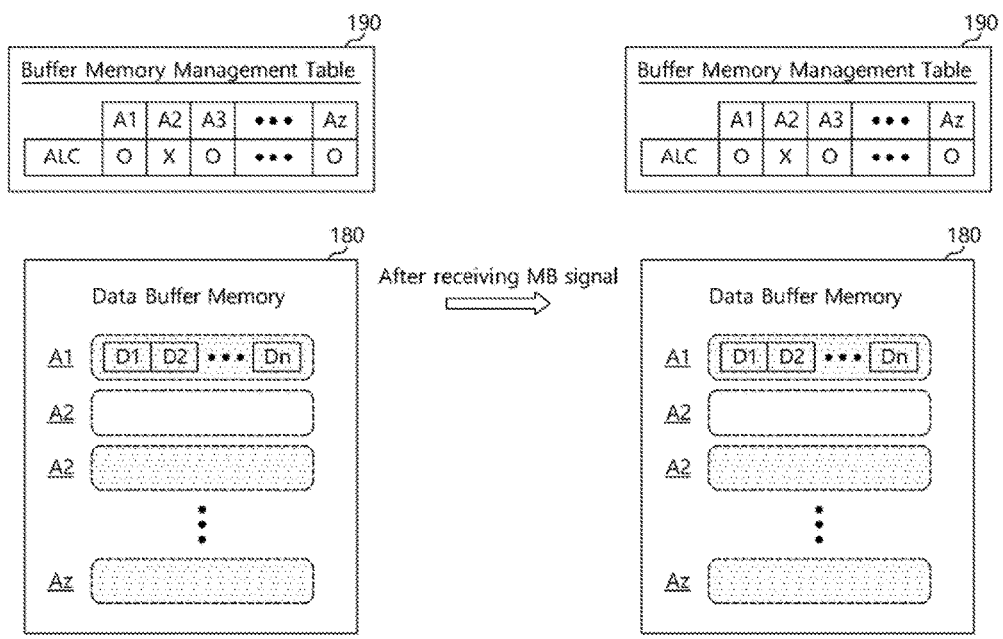

FIGS. 5 and 6 are diagrams to describe the operations of the buffer manager 190 of FIG. 1 in accordance with the embodiment. FIG. 5 illustrates the operation of the buffer manager 190 when the buffer release signal RB is received, and FIG. 6 illustrates the operation of the buffer manager 190 when the buffer retention signal MB is received. In describing FIGS. 5 and 6, it is presumed that a first region A1 of the data buffer memory 180 is allocated (ALC) to store the data D1 to Dn of FIG. 4. In the buffer memory management table of FIGS. 5 and 6, the symbol "O" may represent that a corresponding region is allocated, and the symbol "X" may represent that a corresponding region is released from allocation.

Referring to FIG. 5, if the buffer release signal RB is received after the data input period Din, the buffer manager 190 may release the allocation of the first region A1 in which the data D1 to Dn are stored. Namely, the buffer manager 190 may update the buffer memory management table to indicate that the first region A1 is released from allocation.

The first region A1 which is released from allocation by the buffer manager 190 may be recognized as a region in which data are not stored, even though the data D1 to Dn are not actually erased. The first region A1 which is released from allocation may be newly allocated to store other data.

Referring to FIG. 6, if the buffer retention signal MB is received after the data input period Din, the buffer manager 190 may retain the allocation of the first region A1 where the data D1 to Dn are stored. That is, if the buffer retention signal MB is received after the data input period Din, the buffer manager 190 may not release the allocation of the first region A1 where the data D1 to Dn are stored. That is, the buffer manager 190 may retain the buffer memory management table to indicate that the first region A1 is allocated.

If the allocation of the first region A1 is retained, the first region A1 will not be newly allocated to store other data. This may represent that the data D1 to Dn stored in the first region A1 may be continuously accessed the same as before. The data D1 to Dn stored in the first region A1 may be used for the error handling operation of the control unit 140.

Figure 7:
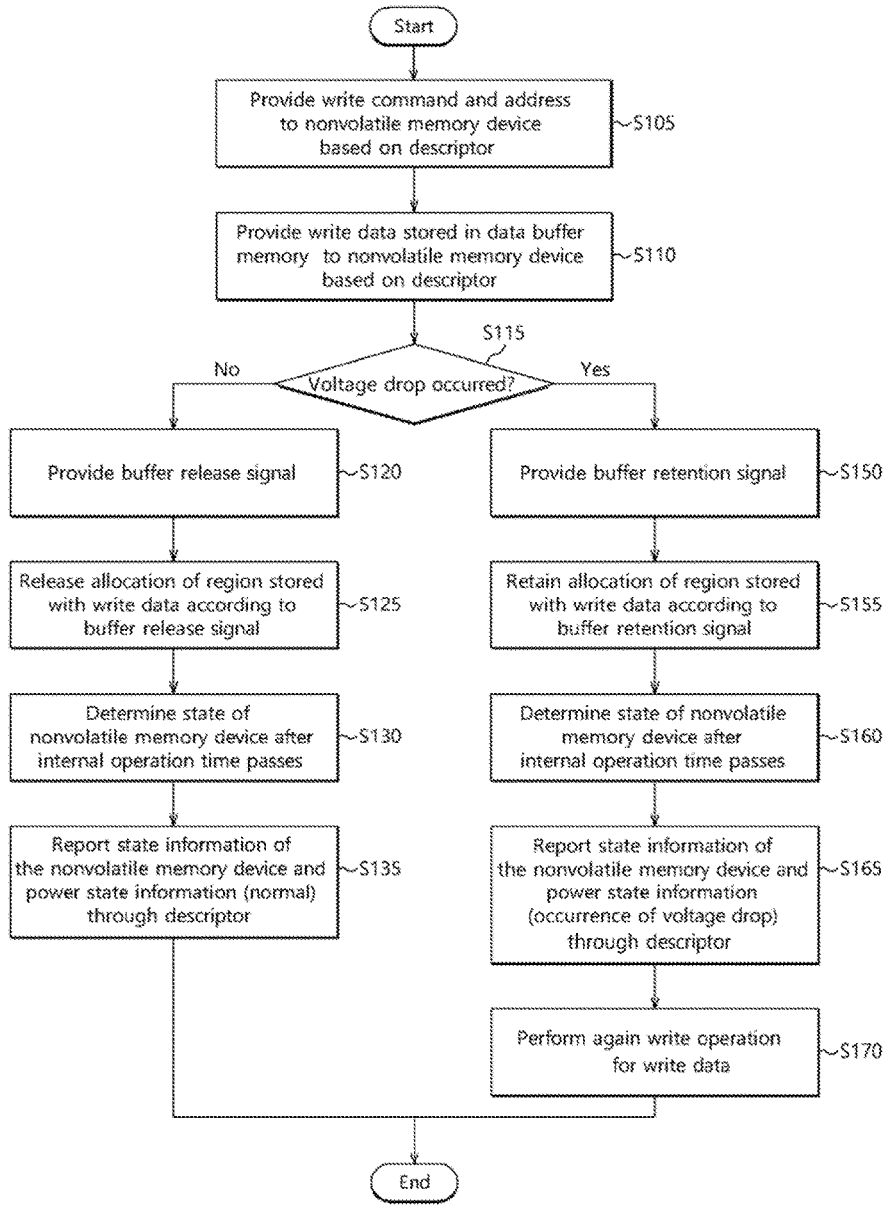
FIG. 7 is a flow chart to describe the operation of a controller in accordance with the embodiment.

FIG. 7 is a flow chart to describe the operation of the controller 130 in accordance with the embodiment. The operation of the controller 130 will be described below in detail with reference to the controller 130 of FIG. 1 and FIG. 7.

Referring to FIG. 7, at step S105, the memory control unit 160 may provide a write command and an address to the nonvolatile memory device 120, based on the descriptor generated by the control unit 140.

At step S110, the memory control unit 160 may provide the write data stored in the data buffer memory 180, to the nonvolatile memory device 120, based on the descriptor. That is, the memory control unit 160 may transmit the write data to the nonvolatile memory device 120, as in the data input period Din shown in FIG. 4.

At step S115, the memory control unit 160 may determine whether or not a voltage drop has occurred. For example, the memory control unit 160 may determine whether the voltage drop signal VD has been received from the voltage detector 170 before the write data are completely provided.

When it is determined that a voltage drop has not occurred (S115=No), the process may proceed to step S120.

At the step S120, the memory control unit 160 may provide a buffer release signal RB to the buffer manager 190.

At step S125, the buffer manager 190 may release the allocation of a region where the write data are stored, according to the buffer release signal RB provided from the memory control unit 160. For example, the buffer manager 190 may update the buffer memory management table such that the region stored with the write data is released from allocation.

At step S130, after an internal operation time tITOP passes, the memory control unit 160 may determine the state of the nonvolatile memory device 120. For instance, the memory control unit 160 may provide a command for determining the state of the nonvolatile memory device 120, to the nonvolatile memory device 120. The nonvolatile memory device 120 may provide a state information ST, that is, an information indicating whether a write operation has passed or failed, to the memory control unit 160, according to such a command.

At step S135, the memory control unit 160 may report the state information ST of the nonvolatile memory device 120 and a power state information PWST to the control unit 140 through a descriptor. Since a voltage drop has not occurred, the power state information PWST may represent normal.

Conversely, when it is determined that a voltage drop has occurred (S115=Yes), the process may proceed to step S150.

At the step S150, the memory control unit 160 may provide a buffer retention signal MB to the buffer manager 190.

At step S155, the buffer manager 190 may retain the allocation of the region stored with the write data, according to the buffer retention signal MB provided from the memory control unit 160.

At step S160, after an internal operation time tITOP passes, the memory control unit 160 may determine the state of the nonvolatile memory device 120. For instance, the memory control unit 160 may provide a command for determining the state of the nonvolatile memory device 120, to the nonvolatile memory device 120. The nonvolatile memory device 120 may provide a state information ST to the memory control unit 160, that is, an information indicating whether a write operation has passed or failed, according to such a command.

At step S165, the memory control unit 160 may report the state information ST of the nonvolatile memory device 120 and a power state information PWST to the control unit 140 through a descriptor. Since a voltage drop has occurred, the power state information PWST may represent voltage drop occurrence.

At step S170, the control unit 140 may again perform a write operation for the write data. Namely, the control unit 140 may determine that the write data are unstably inputted based on the power state information PWST reported from the memory control unit 160. The control unit 140 may perform an error handling operation for the write data. For example, the control unit 140 may generate a new descriptor such that the write operation for the write data retained in the data buffer memory 180 is performed again. The memory control unit 160 may perform the writing process starting from the step S105, based on the newly generated descriptor.

Figure 8:
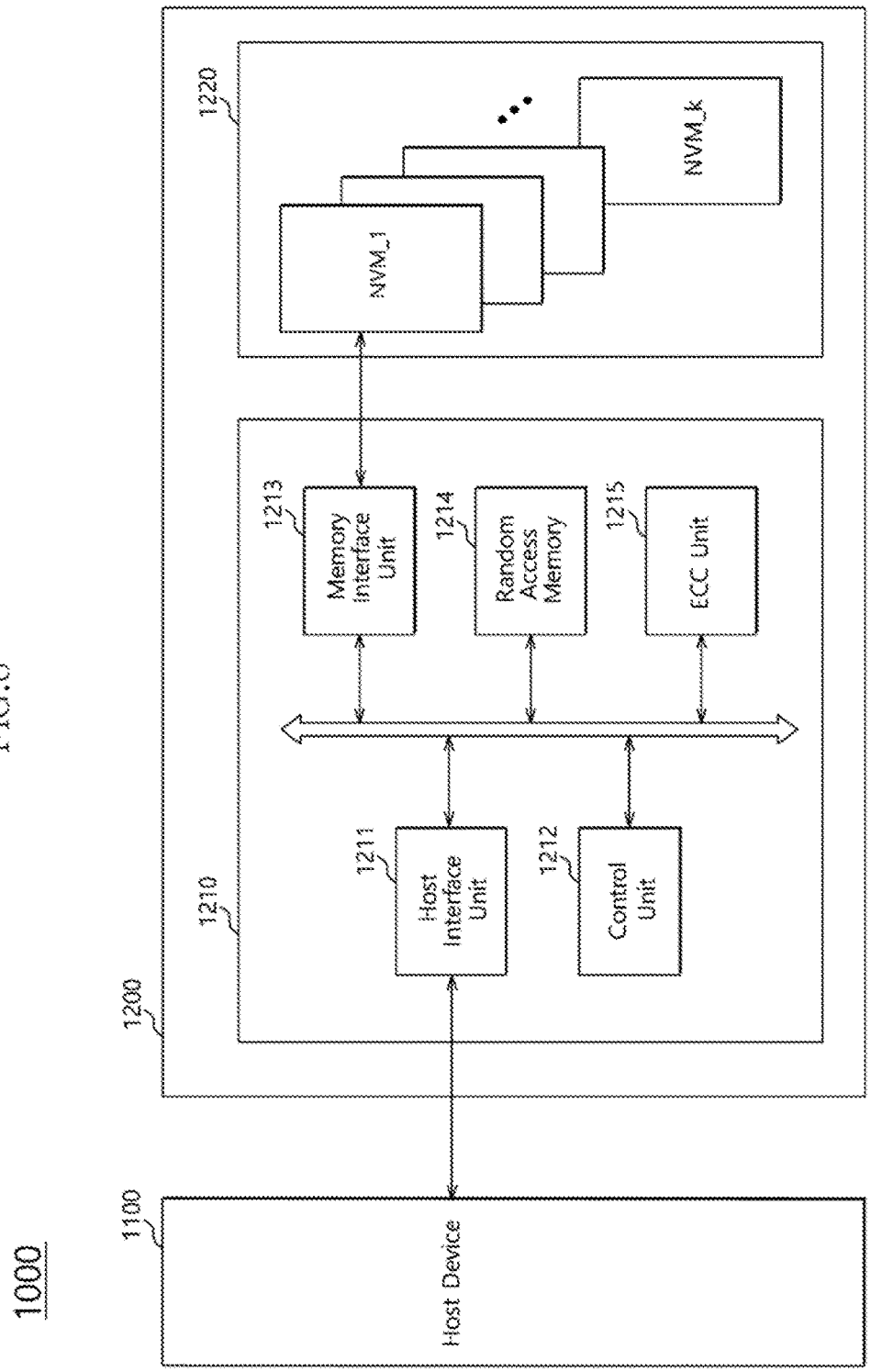
FIG. 8 is a block diagram illustrating a data processing system in accordance with an embodiment.

FIG. 8 is a block diagram illustrating a data processing system 1000 in accordance with an embodiment.

Referring to FIG. 8, the data processing system 1000 may include a host device 1100 and a data storage device 1200.

The data storage device 1200 may include a controller 1210 and a nonvolatile memory device 1220. The data storage device 1200 may be used by being coupled to a host device 1100 such as a mobile phone, an MP3 player, a laptop computer, a desktop computer, a game player, a television (TV), an in-vehicle infotainment system, and so forth. The data storage device 1200 is also referred to as a memory system.

The controller 1210 may include a host interface unit 1211, a control unit 1212, a memory interface unit 1213, a random access memory 1214, and an error correction code (ECC) unit 1215.

The host interface unit 1211 may interface the host device 1100 and the controller 1210. For example, the host interface unit 1211 may communicate with the host device 1100 through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATH) protocol, a serial advanced technology attachment (SATA) protocol, a small computer system interface (SCSI) protocol, and a serial attached SCSI (SAS) protocol.

The control unit 1212 may control general operations of the controller 1210 in response to a request from the host device 1100. The control unit 1212 may drive a firmware or a software for controlling the nonvolatile memory device 1220.

The random access memory 1214 may be used as the working memory of the control unit 1212. The random access memory 1214 may be used as a buffer memory which temporarily stores data read out from the nonvolatile memory device 1220 or data provided from the host device 1100.

The memory interface unit 1213 may interface the controller 1210 and the nonvolatile memory device 1220. The memory interface unit 1213 may provide a command and an address to the nonvolatile memory device 1220. Furthermore, the memory interface unit 1213 may exchange data with the nonvolatile memory device 1220.

The ECC unit 1215 may encode data to be stored in the nonvolatile memory device 1220 using a predetermined error correction code. Also, the ECC unit 1215 may decode data read out from the nonvolatile memory device 1220 using the predetermined error correction code.

The nonvolatile memory device 1220 may be used as the storage medium of the data storage device 1200. The nonvolatile memory device 1220 may include a plurality of nonvolatile memory chips or dies NVM_1 to NVM_k.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, an eMMC, an RS-MMC and a micro-MMC, a secure digital card in the form of an SD, a mini-SD and an micro-SD, universal serial bus (USB) storage device, a universal flash storage (UFS) device, a Personal Computer Memory Card International Association (PCMCIA) card, a compact flash (CF) card, a smart media card, a memory stick, and so forth.

Figure 9:
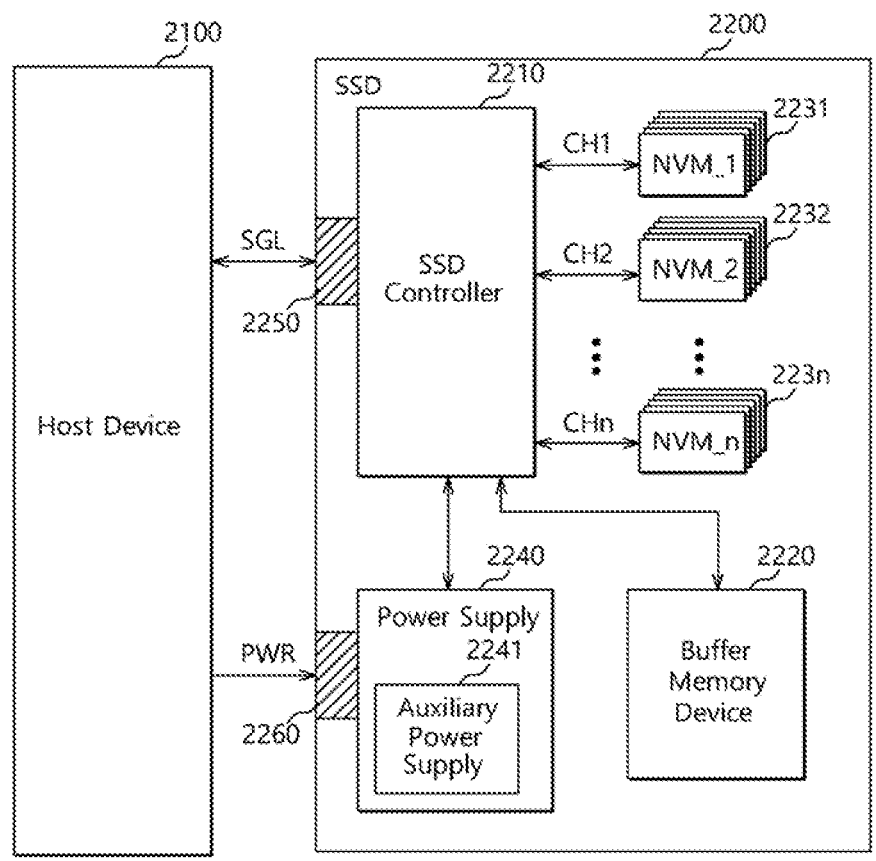
FIG. 9 is a block diagram illustrating a data processing system including a solid state drive (SW) in accordance with an embodiment.

FIG. 9 is a block diagram illustrating a data processing system 2000 including a solid state drive (SSD) in accordance with an embodiment.

Referring to FIG. 9, the data processing system 2000 may include a host device 2100 and a solid state drive (SSD) 2200.

The SSD 2200 may include an SSD controller 2210, a buffer memory device 2220, nonvolatile memory devices 2231 to 223n, a power supply 2240, a signal connector 2250, and a power connector 2260.

The SSD controller 2210 may access the nonvolatile memory devices 2231 to 223n in response to a request from the host device 2100.

The buffer memory device 2220 may temporarily store data, in the nonvolatile memory devices 2231 to 223n. Further, the buffer memory device 2220 may temporarily store data read out from the nonvolatile memory devices 2231 to 223n. The data temporarily stored in the buffer memory device 2220 may be transmitted to the host device 2100 or the nonvolatile memory devices 2231 to 223n under control of the SSD controller 2210.

The nonvolatile memory devices 2231 to 223n may be used as storage media of the SSD 2200. The nonvolatile memory devices 2231 to 223n may be coupled with the SW controller 2210 through a plurality of channels CH1 to CHn, respectively. One or more nonvolatile memory devices may be coupled to one channel. The nonvolatile memory devices coupled to each channel may be coupled to the same signal bus and data bus.

The power supply 2240 may provide power PWR inputted through the power connector 2260, to the inside of the SSD 2200. The power supply 2240 may include an auxiliary power supply 2241. The auxiliary power supply 2241 may supply power to allow the SSD 2200 to be normally terminated when a sudden power-off occurs. The auxiliary power supply 2241 may include large capacitance capacitors capable of charging power PWR.

The SSD controller 2210 may exchange a signal SGL with the host device 2100 through the signal connector 2250. The signal SGL may include a command, an address, data, and so forth. The signal connector 2250 may be configured by a connector such as of universal flash storage (UFS), parallel advanced technology attachment (PATA), serial advanced technology attachment (SATA), small computer system interface (SCSI), serial attached SCSI (SAS), peripheral component interconnection (PCI) and PCI express (PCI-E) protocols, according to an interface scheme between the host device 2100 and the SSD 2200.

Figure 10:
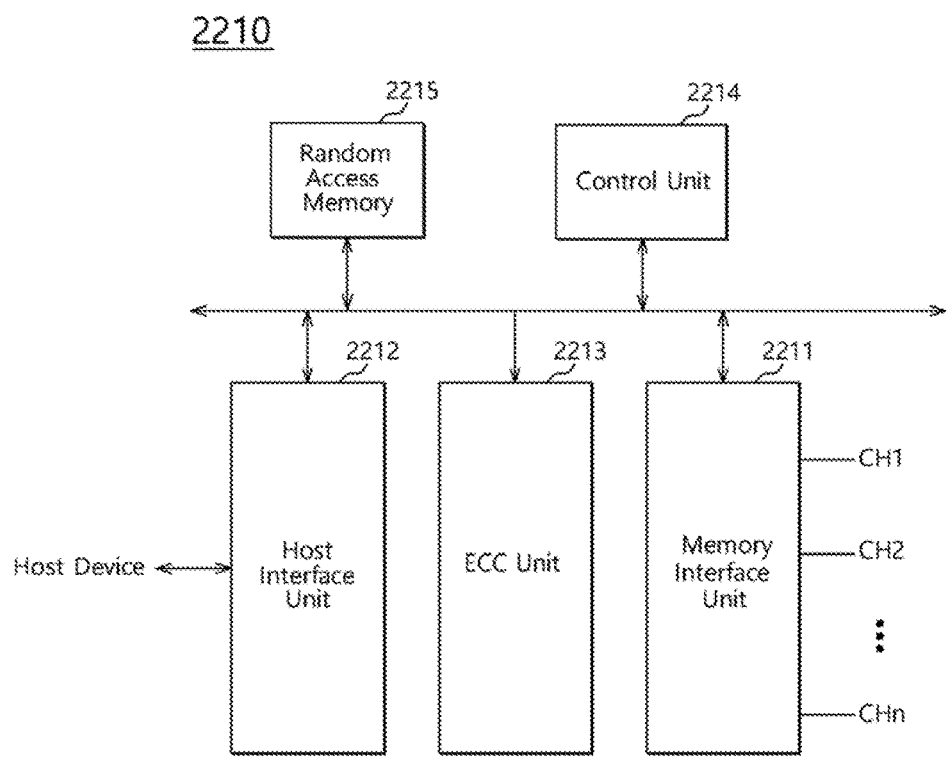
FIG. 10 is a block diagram illustrating the SSD controller shown in FIG. 9.

FIG. 10 is a block diagram illustrating the SSD controller 2210 shown in FIG. 9.

Referring to FIG. 10, the SSD controller 2210 may include a memory interface unit 2211, a host interface unit 2212, an error correction code (ECC) unit 2213, a control unit 2214, and a random access memory 2215.

The memory interface unit 2211 may provide control signals such as commands and addresses to the nonvolatile memory devices 2231 to 223n. Moreover, the memory interface unit 2211 may exchange data with the nonvolatile memory devices 2231 to 223n. The memory interface unit 2211 may distribute data transmitted from the buffer memory device 2220 to the respective channels CH1 to CHn, under control of the control unit 2214. Furthermore, the memory interface unit 2211 may transmit data read out from the nonvolatile memory devices 2231 to 223n to the buffer memory device 2220, under control of the control unit 2214.

The host interface unit 2212 may provide interfacing with respect to the SSD 2200 in correspondence to the protocol of the host device 2100. For example, the host interface unit 2212 may communicate with the host device 2100 through any one of universal flash storage (UFS), parallel advanced technology attachment (PATA), serial advanced technology attachment (SATA), small computer system interface (SCSI), serial attached SCSI (SAS), peripheral component interconnection (PCI) and PCI express (PCI-E) protocols. In addition, the host interface unit 2212 may perform a disk emulating function of supporting the host device 2100 to recognize the SSD 2200 as a hard disk drive (HDD).

The control unit 2214 may analyze and process the signal SGL inputted from the host device 2100. The control unit 2214 may control operations of the buffer memory device 2220 and the nonvolatile memory devices 2231 to 223n according to a firmware or a software for driving the SSD 2200. The random access memory 2215 may be used as a working memory for driving the firmware or the software.

The ECC unit 2213 may generate parity data to be transmitted to the nonvolatile memory devices 2231 to 223n, among data stored in the buffer memory device 2220. The generated parity data may be stored, along with data, in the nonvolatile memory devices 2231 to 223n. The ECC unit 2213 may detect an error of the data read out from the nonvolatile memory devices 2231 to 223n. When the detected error is within a correctable range, the ECC unit 2213 may correct the detected error.

Figure 11:
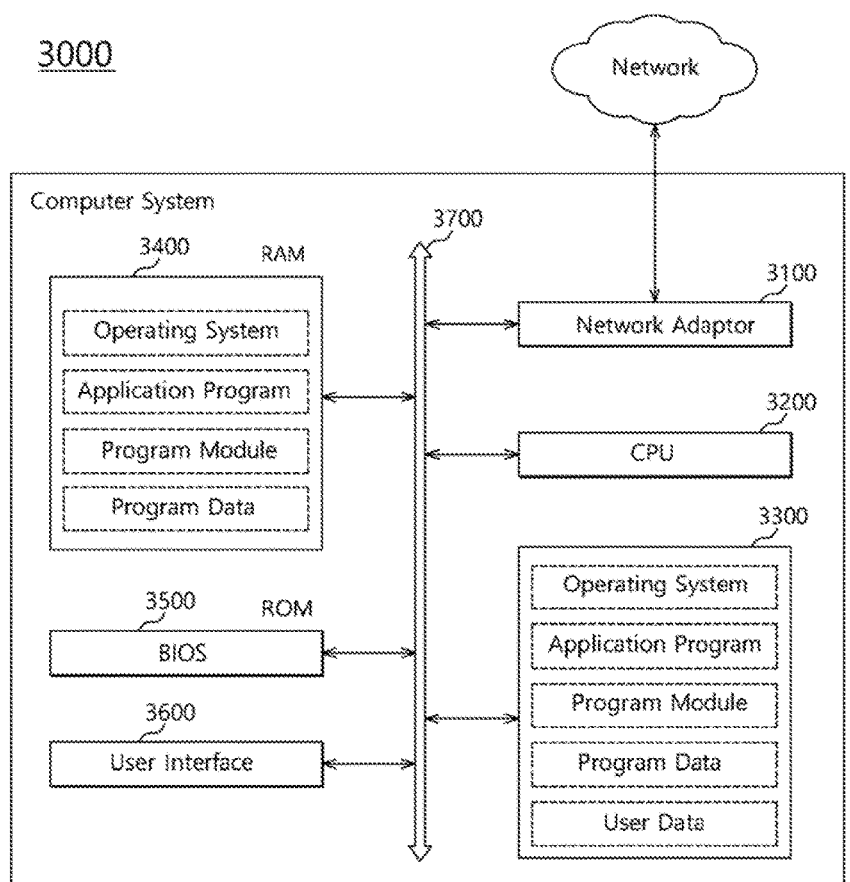
FIG. 11 is a block diagram illustrating a computer system to which a data storage device in accordance with an embodiment is mounted.

FIG. 11 is a block diagram illustrating a computer system 3000 having a data storage device in accordance with an embodiment is mounted.

Referring to FIG. 11, the computer system 3000 includes a network adaptor 3100, a central processing unit (CPU) 3200, a data storage device 3300, a random access memory (RAM) 3400, a read only memory (ROM) 3500 and a user interface 3600, which are electrically coupled to a system bus 3700. The data storage device 3300 may be configured by the data storage device 100 shown in FIG. 1, the data storage device 1200 shown in FIG. 8 or the SSD 2200 shown in FIG. 9.

The network adaptor 3100 may provide interfacing between the computer system 3000 and external networks. The central processing unit 3200 may perform general operations processing for driving an operating system residing at the RAM 3400 or an application program.

The data storage device 3300 may store general data needed in the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program data needed for driving programs, which are read out from the data storage device 3300, may be loaded in the RAM 3400. A basic input/output system (BIOS) which is activated before the operating system is driven, may be stored in the ROM 3500. Information exchange between the computer system 3000 and a user may be implemented through the user interface 3600.

While various embodiments have been described above, it will be understood to those skilled in the art that the embodiments described are examples only. Accordingly, the data storage device and the operating method thereof described herein should not be limited based on the described embodiments.

What is claimed is:

1. A data storage device comprising:
   a nonvolatile memory device;
   a control unit configured to generate a descriptor in which works for controlling the nonvolatile memory device are written;
   a memory control unit configured to provide control signals and write data to the nonvolatile memory device based on the descriptor; and
   a voltage detector configured to provide a voltage drop signal to the memory control unit in a case where a first operating voltage provided to the memory control unit or a second operating voltage provided to the nonvolatile memory device drops,
   wherein the voltage detector provides the voltage drop signal before the write data are completely provided, and
   the control unit determines that the write data are unstably inputted based on power state information indicating that a voltage drop has occurred and generates a new descriptor again based on a determination result after the write data are completely provided.

2. The data storage device according to claim 1, further comprising:
   a data buffer memory configured to temporarily store the write data; and
   a buffer manager configured to manage allocation and release for regions of the data buffer memory.

3. The data storage device according to claim 2, wherein, in a case where the voltage drop signal is received before providing of the write data is completed, the memory control unit provides a buffer retention signal to the buffer manager to control allocation of a region stored with the write data, not to be released so that the region stored with the write data is not newly allocated to store other write data.

4. The data storage device according to claim 3, wherein the buffer manager retains allocation of the region stored with the write data, according to the buffer retention signal.

5. The data storage device according to claim 3, wherein the memory control unit reports the power state information indicating that the voltage drop has occurred, to the control unit, through the descriptor.

6. The data storage device according to claim 5, wherein the control unit performs again a write operation for the write data, based on the power state information.

7. The data storage device according to claim 2, wherein, in a case where the voltage drop signal is not received before providing of the write data is completed, the memory control unit provides a buffer release signal to the buffer manager to control allocation of the region stored with the write data, to be released.

8. The data storage device according to claim 7, wherein the buffer manager releases allocation of the region stored with the write data, according to the buffer release signal.

9. The data storage device according to claim 1, wherein, in a case where a level of the first operating voltage is lower than a level of a first threshold voltage, the voltage detector provides the voltage drop signal to the memory control unit.

10. The data storage device according to claim 1, wherein, in a case where a level of the second operating voltage is lower than a level of a second threshold voltage, the voltage detector provides the voltage drop signal to the memory control unit.

11. A method for operating a data storage device including a nonvolatile memory device and a controller which controls the nonvolatile memory device, the method comprising:
provide data to the nonvolatile memory device;
determining whether a voltage drop has occurred in even any one of a first operating voltage provided to the controller and a second operating voltage provided to the nonvolatile memory device, before the data are completely provided; and
retaining allocation for a region of a data buffer memory where the data are stored after the data are completely provided, in a case where it is determined that a voltage drop has occurred.

12. The method according to claim 11, further comprising:
performing again a write operation for the data.

13. The method according to claim 11, wherein allocation for the region of the data buffer memory where the data are stored is released, in a case where it is determined that a voltage drop has not occurred.

14. A data storage device comprising:
a nonvolatile memory device;
a control unit configured to generate a first descriptor in which works for controlling the nonvolatile memory device are written;
a memory control unit configured to provide control signals and data to the nonvolatile memory device based on the first descriptor; and
a voltage detector configured to provide a voltage drop signal to the memory control unit in a case where even any one of a first operating voltage provided to the memory control unit and a second operating voltage provided to the nonvolatile memory device has dropped,
wherein the voltage detector provides the voltage drop signal before the write data are completely provided, and
the control unit determines that the write data are unstably inputted based on power state information indicating that a voltage drop has occurred and generates a second descriptor again based on a determination result after the write data are completely provided, and
the memory control unit reports the power state information indicating that the voltage drop has occurred, to the control unit, through the first descriptor.

15. The data storage device according to claim 14, wherein the control unit performs an error handling operation for a write operation of the data performed according to the first descriptor, by referring to the power state information.

16. The data storage device according to claim 15, wherein the memory control unit performs again a write operation of the data based on the generated second descriptor.

17. The data storage device according to claim 16, wherein the memory control units provides again the control signals and the data to the nonvolatile memory device based on the second descriptor.

18. The data storage device according to claim 14, further comprising:
a data buffer memory configured to store the data; and
a buffer manager configured to manage allocation and release for regions of the data buffer memory.

19. The data storage device according to claim 18, wherein the memory control unit provides a buffer retention signal to the buffer manager based on the voltage drop signal.

20. The data storage device according to claim 19, wherein the buffer manager retains allocation for a region of the data buffer memory stored with the data, according to the buffer retention signal so that the region of the data buffer memory stored with the write data is not newly allocated to store other write data.

* * * * *